United States Patent [19]
Sato et al.

[11] Patent Number: 5,828,826
[45] Date of Patent: Oct. 27, 1998

[54] PROCESSING APPARATUS HAVING A NONVOLATILE MEMORY TO WHICH A SUPPLY VOLTAGE IS SUPPLIED THROUGH A SHARED TERMINAL

[75] Inventors: Koji Sato, Tenri; Hirotake Hayashi, Yamabe-gun; Fumitaka Nishikawa, Soraku-gun, all of Japan

[73] Assignee: Sharp Kabushiki Kaisha, Osaka, Japan

[21] Appl. No.: 671,635

[22] Filed: Jun. 28, 1996

[30] Foreign Application Priority Data

Jul. 27, 1995 [JP] Japan ................................. 7-191625

[51] Int. Cl.⁶ ............................ G06F 11/00; G11C 16/06
[52] U.S. Cl. ............................... 395/183.06; 395/183.03; 365/226; 365/201
[58] Field of Search ...................... 395/183.06, 183.03, 395/183.18, 183.01; 365/226, 201, 185.23, 229; 324/763

[56] References Cited

U.S. PATENT DOCUMENTS

| | | |
|---|---|---|
| 4,485,456 | 11/1984 | Toyoda ........................................ 395/479 |
| 4,766,567 | 8/1988 | Kato .......................................... 395/750 |
| 4,979,172 | 12/1990 | Murase et al. ...................... 395/183.03 |
| 5,068,783 | 11/1991 | Tanagawa et al. ................. 395/183.03 |
| 5,491,825 | 2/1996 | Sakuma ..................................... 395/306 |
| 5,537,584 | 7/1996 | Miyai et al. ....................... 395/183.18 |

FOREIGN PATENT DOCUMENTS

A2206094  8/1990  Japan.
A-461695  2/1992  Japan.

*Primary Examiner*—Robert W. Beausoliel, Jr.
*Assistant Examiner*—Ly V. Hua

[57] ABSTRACT

A processing apparatus capable of feeding voltage necessary when writing data in a programmable nonvolatile memory without increasing the number of terminals is presented. A control signal MO for changing over the actual operation mode and test mode, and a program voltage VPP necessary when writing or erasing data in an EEPROM are provided.

6 Claims, 5 Drawing Sheets

PROCESSING APPARATUS HAVING A NONVOLATILE MEMORY TO WHICH A SUPPLY VOLTAGE IS SUPPLIED THROUGH A SHARED TERMINAL

BACKGROUND OF THE INVENTION

1. Field of the Invention

The present invention relates to a microcomputer, and more particularly to a microcomputer incorporating an electrically programmable nonvolatile memory such as an EPROM (electrically programmable read-only memory), an EEPROM (electrically erasable programmable read-only memory), or a flash memory.

2. Description of the Prior Art

Generally, a mask ROM is used to store a program for operating a processing apparatus known as a microcomputer. When the program ROM is an electrically programmable nonvolatile memory, such as an EEPROM, a processing apparatus is provided in which the program data can be written or changed not only when fabricating the processing apparatus, but also by the user of the processing apparatus. Moreover, a processing apparatus incorporating a nonvolatile memory as a data memory is known.

In a processing apparatus incorporating such an electrically programmable nonvolatile memory, a voltage higher than an ordinary supply voltage is needed for writing or erasing data. To supply high voltage for writing (erasing), hitherto, a circuit for generating a high voltage was provided inside the processing apparatus as a first constitution, or a high voltage power source terminal for nonvolatile memory was added as a new terminal in a second constitution.

FIG. 8 is a block diagram of a processing apparatus 101 which is a structural example of the second constitution. The processing apparatus 101 consists of a processing circuit 112, a mode changeover circuit 113, and an EEPROM 114. The processing apparatus 101 also comprises a VDD terminal 102 for feeding an ordinary supply voltage VDD, a GND terminal 103 for feeding a grounding voltage GND which is a reference voltage, a reset terminal 104 in which a hardware reset signal RS of the processing apparatus 101 is supplied, an oscillation terminal 105 to which a clock signal CL from an external oscillation circuit is supplied, an output terminal 108 for data output, an input terminal 109 for data input to the processing apparatus 101, an input and output terminal 110 commonly used for data input and data output, and a mode selector terminal 106 for receiving a changeover control signal CH which sets the operating modes as an ordinary actual operation mode or a test mode, and a power source terminal 107 for feeding a program voltage VPP which is a high voltage necessary when writing or erasing data to the EPPROM 114. The output terminal 108, the input terminal 109, and the input and output terminal 110 may each comprise a plurality of terminal connections.

The processing apparatus 101 is operated by the voltages supplied through the VDD terminal 102 and the GND terminal 103. The processing apparatus 101 processes the input data supplied through the input terminal 109 or input and output terminal 110, according to the program stored in the EEPROM 114, and issues output date from the output terminal 108 or input and output terminal 110. The processing circuit 112 operates cyclically with timing based on the clock signal CL received from an external device through the oscillation terminal 105.

The processing apparatus 101 functions in the actual operation mode according to the program stored in the EEPROM 114, or the test mode for inspecting functions of the processing apparatus 101. The two modes are determined by the signal level of the mode changeover signal CH received through the mode changeover terminal 106. The mode changeover signal CH is fed into the mode changeover circuit 113, which determines the mode of operation, and a corresponding mode setting signal is applied to the processing circuit 112.

A first processing apparatus, having an internal circuit for supplying a high voltage for writing or erasing memory data, is disclosed in Japanese Unexamined Patent Publication JP-A 2-206094 (1990). The first processing apparatus comprises a power source circuit for feeding a supply voltage, and a polarity inverting circuit for feeding a voltage having a polarity opposite that of the supply voltage. The supply voltage and the inverted voltage are combined to provide a program voltage necessary for writing into a nonvolatile memory. Thus, this processing apparatus is designed to generates a supply voltage and a higher program voltage by a single power source.

Another processing apparatus, having an internal circuit for supplying a high voltage for writing or erasing program memory data, is disclosed in Japanese Unexamined Patent Publication JPA 4-61695 (1992). In the processing apparatus, the program voltage supplied when writing into the nonvolatile memory, and the logic voltage supplied when reading out data from the nonvolatile memory are externally supplied from one terminal, and an external switching circuit connected to the terminal controls which voltage is supplied to the processing apparatus.

The prior art, however, has the following problems.

First, in the case of the type having internal high voltage generating circuit, a circuit of large scale must be built in, which leads to a cost increase.

In the case of the type having an added terminal, the size of a chip which embodies the circuitry, becomes larger, the number of terminals increases and the shape of the processing apparatus is changed, leading to inconvenience for the user.

SUMMARY OF THE INVENTION

It is hence a primary object of the invention to provide a processing apparatus capable of feeding a voltage necessary when writing data into a programmable nonvolatile memory, without increasing the number of apparatus terminals.

To achieve this object, the invention provides a processing apparatus comprising:

a nonvolatile memory capable of writing program data electrically when a write voltage of a predetermined first voltage is supplied to the processing apparatus, processing means for processing data on the basis of the program data stored in the nonvolatile memory when an operation voltage of a second voltage lower than the first voltage is supplied to the processing apparatus, mode changeover means for setting the processing apparatus in an actual operation mode in which the processing means processes data on the basis of the program data stored in the nonvolatile memory when a first mode changeover signal having a third voltage lower than the second voltage is supplied to the processing apparatus, or setting the processing apparatus in a test mode in which a determination is made whether the operation of the processing means is normal when a second mode changeover signal having the second voltage level is supplied to the processing apparatus, and plural terminals for receiving signals to be fed to the nonvolatile memory, the processing means and the mode changeover means at the described voltage levels, wherein one of the terminals is a shared terminal which receives the first or write voltage, to be supplied to the nonvolatile memory or the first or the second mode changeover voltage to be supplied to the mode changeover means.

The invention also comprises voltage adjusting means which is connected between the shared terminal and the mode changeover means to convert the level of the first voltage to the second voltage level when the first voltage is supplied through the shared terminal, and to output the second voltage level to the mode changeover means as the second mode changeover signal.

In the invention, a reset signal is applied to the processing means from one of the plural terminals to reset a signal held in the processing means.

The processing apparatus further comprises transmission control means for applying the output of the voltage adjusting means to the mode changeover means when the reset signal is received, with transmission control means being interposed between the voltage adjusting means and the mode changeover means.

The invention moreover comprises a control register for outputting the second or third voltage as controlled by the processing means, and an AND circuit to one input of which an output of the voltage adjusting means is supplied and to the other input of which an output of the control register is supplied. The AND circuit is interposed between the voltage adjusting means and mode changeover means.

In the invention, a reset signal is applied to the processing means from one of the plural terminals to reset a signal held in the processing means. The processing apparatus further comprises: voltage converting means for outputting the second or third voltage according to the input voltage at the shared terminal. The voltage converting means is interposed between the shared terminals and the mode changeover means.

Transmission control means applies the output of the voltage converting means to the mode changeover means when the reset signal is applied. The transmission control means is interposed between the voltage converting means and mode changeover means.

In the invention, the voltage converting means comprises voltage detecting means for outputting the second voltage when the first voltage is supplied, and for outputting the third voltage when the second voltage or third voltage is supplied. Voltage control means for applies the second mode changeover signal to the mode changeover means when the second voltage is supplied from the voltage detecting means, and applies the first mode changeover signal to the mode changeover means when the third voltage is supplied.

The processing means returns the value of the data held inside to a predetermined value, when reset is executed by input of the reset signal.

In the test mode, a determination is made as to whether the processing means can process as specified on the basis of the program data stored in the nonvolatile memory, and whether the signals given to each terminal are fed to specified means.

The invention relates to a processing apparatus incorporating an electrically programmable nonvolatile memory and a terminal arrangement in which a shared terminal receives first and second mode changeover signals, and a first voltage supplied when data are to be written into the nonvolatile memory.

In the shared terminal constitution, however, the first voltage for data writing (erasing) is directly supplied to the mode changeover means, and elements composing the mode changeover means may be broken. As a countermeasure, the processing apparatus of the invention is characterized by voltage adjusting means, for converting the level from the first voltage to second voltage, disposed between the shared terminal and the mode changeover means. By the insertion of the voltage adjusting means, the first voltage is prevented from being applied directly to the mode changeover means. In this constitution only, however, an unintended mode changeover may occur due to input of the first voltage. To avoid this, the processing apparatus of the invention is further characterized by transmission control means disposed to transmit the output of the voltage adjusting means to the mode changeover means only when the reset signal is applied. As a result, unless the first voltage is applied to the shared terminal when the reset signal is applied, unintended mode changeover is not caused by application of the first voltage.

Moreover, with connection of the transmission control means to transmit the output of the voltage adjusting means to the mode changeover means only when resetting, only the state setting is affected by the input to the shared terminal only at the time of resetting. In the invention, furthermore, in order to enable mode setting from the processing means at times other time than resetting, a control register and an AND circuit are provided to produce an input signal to the mode changeover means on the basis of the outputs of the control register and voltage adjusting means. For example, the control register may be a flip-flop which is set by a signal from the processing means, and reset by a reset signal. Accordingly, when resetting, the output of the voltage adjusting means is fed into the mode changeover means, and the mode is set by the reset signal. At times other than resetting, when the output of the control register is set by a signal from the processing means, the output of the AND circuit becomes "0" regardless of the output level of the voltage adjusting means, and the mode is set accordingly (for example, the actual operation mode is set).

In disposing the transmission control means to transmit the output of the voltage adjusting means to the mode changeover means only when resetting, and with the test mode set by applying the second voltage to the shared terminal, resetting cannot be executed, in the actual operation mode at the user side, with the first or write voltage being supplied to the shared terminal. This is because the processing apparatus is changed over in the test mode. To solve this problem, the invention further provides a voltage converting means for outputting a second mode changeover signal when the input to the shared terminal is the second voltage, and for outputting a first mode changeover signal when the input to the shared terminal is the third voltage or the first voltage. The voltage converting means is disposed between the shared terminal and the mode changeover means. Further transmission control means is disposed to transmit the output of the voltage converting means to the mode changeover means only when resetting. Accordingly, in the actual operation mode at the user side, when resetting is executed with the first voltage supplied to the shared terminal, the mode is maintained at the actual operation mode, and mode change can be prevented.

As described herein, according to the invention, in the processing apparatus incorporating an electrically programmable nonvolatile memory, a high voltage generating circuit or additional terminal is not required. Therefore, the invention avoids an increase in chip size, an increase in the number of terminals, a shape change or the like. The invention is thus very effective in providing a very convenient and useful processing apparatus incorporating a nonvolatile memory.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

With reference to the drawings, preferred embodiments of the invention are described below.

Figure 1:
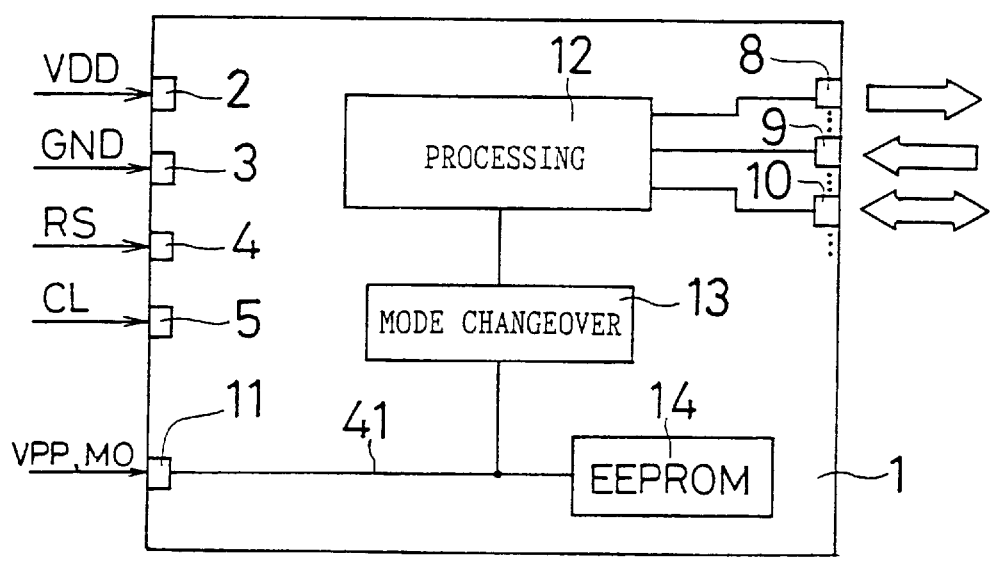
FIG. 1 is a block diagram showing a constitution of a processing apparatus 1 in a first embodiment of the invention.

FIG. 1 is a block diagram of a processing apparatus 1 in a first embodiment of the invention. The processing apparatus 1 consists of a processing circuit 12, a mode changeover circuit 13, and an EEPROM 14. The processing apparatus 1 further comprises 4a VDD terminal 2 for feeding supply voltage VDD, a GND terminal 3 for feeding a grounding voltage GND which is a reference potential, a reset terminal 4 for receiving a hardware reset signal RS for the processing circuit, an oscillation terminal 5 for receiving a clock signal CL from an external oscillation circuit, an output terminal 8 for data output from the processing apparatus 1, an input terminal 9 for data input to the processing apparatus, and an input and output terminal 10 which shares data input and data output. The apparatus 1 further comprises a shared terminal 11 commonly used to input the control signal MO for switching between the actual operation mode and the test mode, and to feed the program voltage VPP which is a relatively high voltage necessary when writing or erasing data in the EEPROM 14. The output terminal 8, the input terminal 9, and the input and output terminal 10 may have one or more terminal connections.

Two modes in the processing apparatus 1 are described below. The actual operation mode is a mode in which the processing circuit processes data according to the program stored in the EEPROM 14. The data received through the input terminal 9 and the input and output terminal 10 are processed to generate output data for issue, through the output terminal 8 or the input and output terminal 10. Writing of program data to the EEPROM 14 is executed in the actual operation mode.

The test mode is a mode for inspecting whether the processing apparatus 1 can process as desired. In the test mode, for example, the processing apparatus is inspected as to whether the data received through the input terminal 9 may be transmitted to the processing circuit 12 without being changed.

The shared terminal 11 is connected to the EEPROM 14 through a power source line 41, and when a program voltage VPP of higher voltage than the supply voltage is applied to the shared terminal 11, the program voltage VPP is supplied to the EEPROM 14 through the power source line 41. In the EEPROM 14, the program voltage VPP is enables the writing of data, while a supply voltage VDD enables written data to be read.

The power source wire 41 is further connected to the mode changeover circuit 13, and when the control signal MO is fed through the shared terminal 11, the mode changeover circuit 13 supplies a mode setting signal to the processing circuit 12 to determine the operating mode of the processing apparatus 1 on the basis of the signal level of the control signal MO.

In this way, by constituting the apparatus 1 with the shared terminal 11 which receives the mode control signal MO, and the rocessing apparatus 1 is provided without increasing the number of terminals. Moreover, an increase in chip size is prevented, and chip shape can be provided without change.

Figure 2:
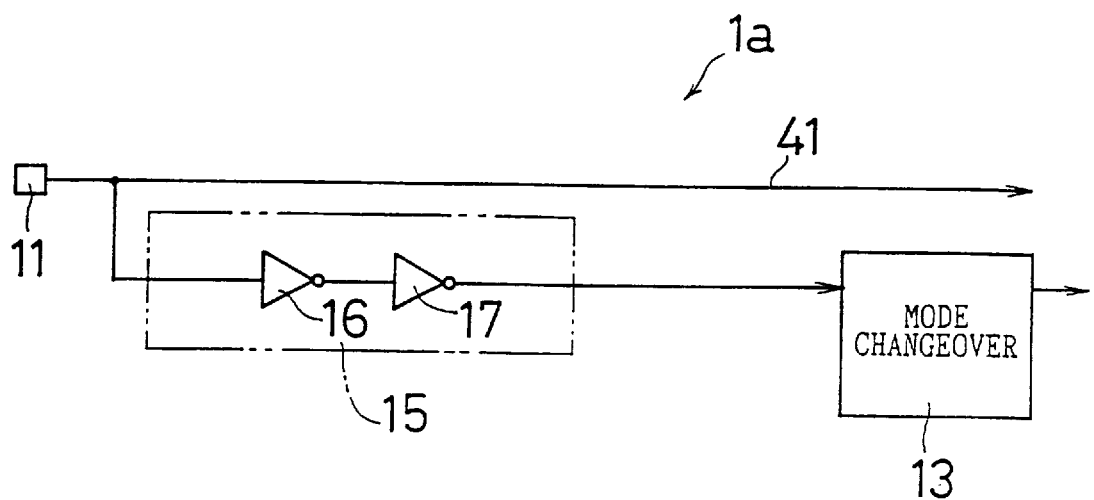
FIG. 2 is a block diagram showing part of a constitution of a processing apparatus la in a second embodiment of the invention.

FIG. 2 is a block diagram showing a part of a processing apparatus la in a second embodiment of the invention. In the processing apparatus la, other constituent elements not shown in the diagram are same as in the processing apparatus 1 in FIG. 1. In the processing apparatus la, as in the processing apparatus 1, the shared terminal 11 and EEPROM 14 are directly coupled through the power source line 41. It is a feature of the processing apparatus la that a voltage adjusting circuit 15 is provided in parallel with the wire 41 for converting the input program voltage VPP to the supply voltage VDD and outputting the supply voltage VDD or grounding voltage GND directly. The voltage adjusting circuit 15 is interposed between the shared terminal 11 and the mode changeover circuit 13. The voltage adjusting circuit 15 is composed of inverter circuits 16 and 17. The first stage inverter circuit 16 is a high withstand voltage inverter for outputting the grounding voltage GND when the supply voltage VDD and the higher program voltage VPP are supplied, and outputting the supply voltage VDD when the grounding voltage GND is supplied. The second stage inverter 17 is an inverter for returning the voltage level inverted by the first stage inverter 16 to the original level. When a grounding voltage GND is supplied, a supply voltage VDD is issued, and, when a supply voltage VDD is supplied, a grounding voltage GND is issued.

In this way, by interposing the voltage adjusting circuit 15 between the shared terminal 11 and the mode changeover circuit 13, the program voltage VPP is prevented from being applied from the terminal 11 directly to the mode changeover circuit 13.

Figure 3:
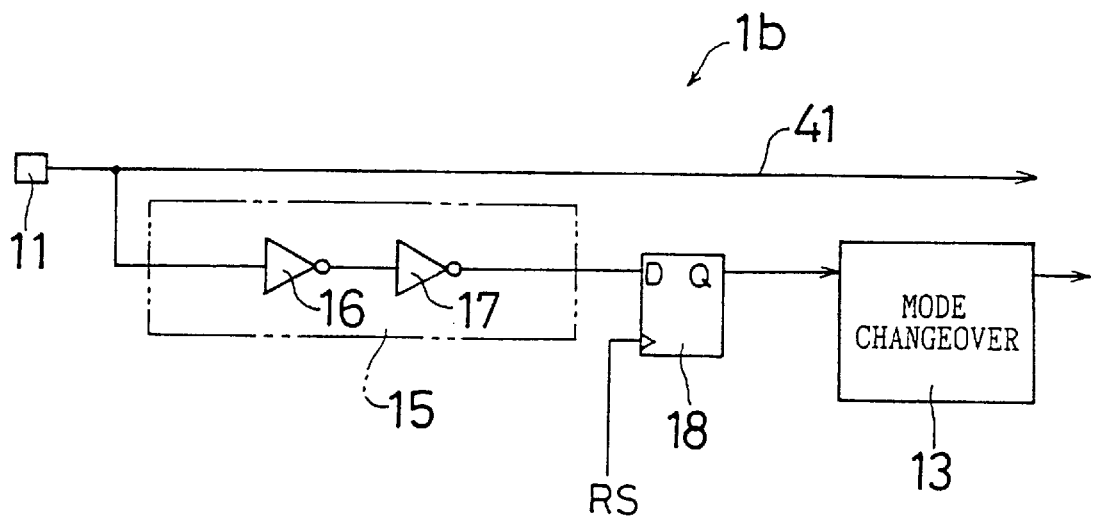
FIG. 3 is a block diagram showing part of a constitution of a processing apparatus lb in a third embodiment of the invention.

FIG. 3 is a block diagram showing a part of a processing apparatus lb in a third embodiment of the invention. In the processing apparatus lb shown in FIG. 3, other constituent elements not shown in the diagram are the same as those in the processing apparatus 1 shown in FIG. 1.

It is a feature of the processing apparatus lb that a D type flip-flop 18, which receives a reset signal Rs, through the clock input CK is provided between the voltage adjusting circuit 15 and the mode changeover circuit 13. The output of the voltage adjusting circuit 17 is supplied to the input D of the D type flip-flop 18, and an output Q is applied from the flip-flop 18 to the mode changeover circuit 13.

Figure 4:
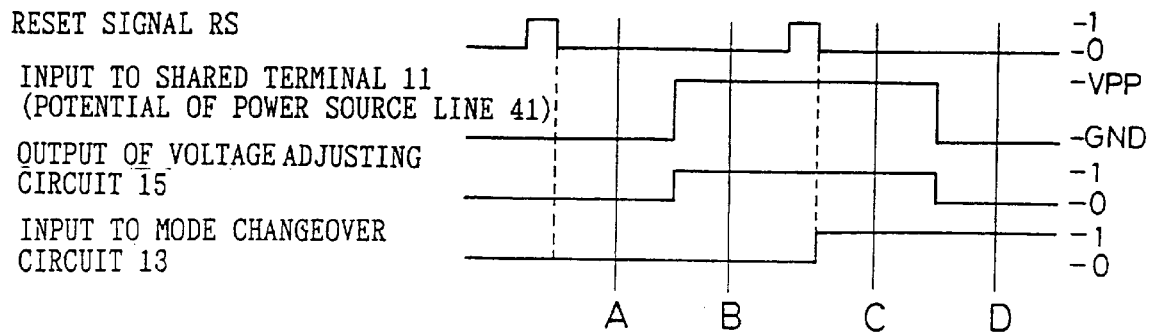
FIG. 4 is a timing chart for explaining the operation of the processing apparatus lb.

FIG. 4 is a timing chart for explaining the operation of the processing apparatus 1b. The output signal of the voltage adjusting circuit 15 is transmitted to the mode changeover circuit 13 only when the reset signal RS is at high "1" level. Therefore, in time periods other than when the reset signal RS is at high level, if the program voltage VPP or the grounding voltage GND is supplied to the shared terminal 11, the output of the voltage adjusting circuit 15 is not fed to the mode changeover circuit 13. That is, the input to the mode changeover circuit 13 is maintained in the previous state.

Further description of the invention is given below with reference to FIG. 4. First, when reset by the reset signal by applying the grounding voltage GND to the shared terminal 11, as indicated by time A, a grounding voltage GND is supplied to the power source line 41, and the input to the mode changeover circuit 13 becomes low "0" level. The mode changeover circuit 13 sets the processing apparatus in either actual operation mode or test mode, depending on the input "0" state. In this state, when the program voltage VPP is supplied to the shared terminal 11, the output of the voltage adjusting circuit 15 becomes a high "1" level. Although the input level of the input D of the D type flip-flop 18 is at high level, since the reset signal RS is not falling, as indicated by time B. the output Q of the D type flip-flop 18 is not changed, and the low "0" level is fed to the mode changeover circuit 13.

In this way, by feeding the program voltage VPP after resetting by setting the input to the mode changeover circuit 13 to "0", it is possible to feed the program voltage VPP to the EEPROM 14 while keeping "0" the input to the mode changeover circuit 13 at an "0"value.

Alternatively, when the reset is executed by supplying program voltage VPP or supply voltage VDD to the shared terminal 11, as indicated by time CCC, the program voltage VPP is supplied to the power source line 41, and the input to the mode changeover circuit 13 is at high "1" level. The mode changeover circuit 13 sets the processing apparatus in either the test mode or the actual operation mode depending on the input "1" state. In this state, when the shared terminal 11 is set at grounding voltage GND, the output of the voltage adjusting circuit 15 is at the low "0" level, but as indicated by time D, the input to the mode changeover circuit 13 remains at the "1" state.

By setting to the grounding voltage GND when the input to the mode changeover circuit 13 is changed to "1", the program voltage VPP can be supplied to the EEPROM 14 while keeping the input to the mode changeover circuit 13 at "1".

It is thus possible to supply the program voltage YPP and grounding voltage GND to the EEPROM 14 while the input to the mode changeover circuit 13 is in an arbitrary state.

Figure 5:
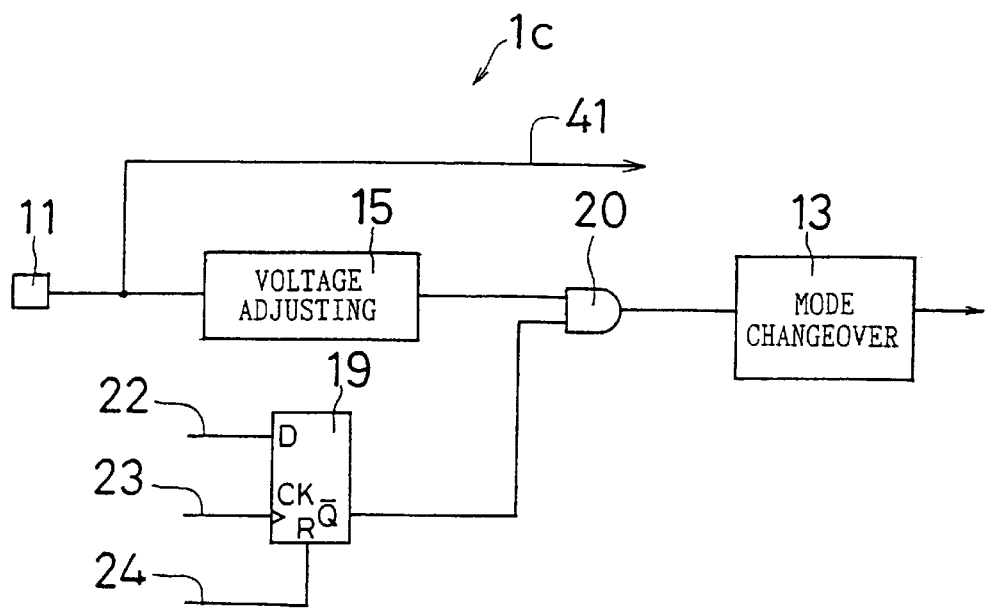
FIG. 5 is a block diagram showing part of a constitution of a processing apparatus lc in a fourth embodiment of the invention.

FIG. 5 shows a block diagram for a part of a processing apparatus 1c in a fourth embodiment of the invention. In the processing apparatus 1c, other constituent elements not shown in the diagram are same as those in the processing apparatus 1 in FIG. 1.

It is a feature of the processing apparatus 1c that the voltage adjusting circuit 15, a control flag 19 and an AND gate 20 are provided. The control flag 19 is a D flip-flop having a reset terminal R. and when a reset signal is applied thereto, the held value is reset. A bit signal for the control flag is applied to the input D through a data bus (not shown), and it is held by the clock signal CL which is applied to the clock input CK.

The AND gate 20 receives the output of the voltage adjusting circuit 15 at its one input, and receives the inverted output of the control flag 19 at its inverted input. The output of the AND gate 20 is applied to the mode changeover circuit 13.

In FIG. 5, the shared terminal 11 is directly coupled to the EEPROM 14 through the power source line 41. Between it and the mode changeover circuit 13 is inserted the voltage adjusting circuit 15 for converting the program voltage VPP to a voltage of supply voltage level (outputting the ordinary supply voltage or grounding voltage as it is). In this embodiment, it is designed to set in the test mode when the input to the mode changeover circuit 13 is "1't, and set in the actual operation mode when the input is "0".

According to this constitution, when the control flag 19 is reset by the reset signal RS, and the input to the shared terminal 11 is the supply voltage VDD or the program voltage VPP, both inputs to the AND gate 20 are "1", and hence the AND gate output is "1", the input of the mode changeover circuit 13 is "1", and the test mode is set. In the test mode, the program voltage VPP is applied to the shared terminal 11, and the output of the AND gate 20 is not changed, so that the test mode is maintained.

On the other hand, while the control flag 19 is reset by reset signal RS with the input to the shared terminal 11 being the grounding voltage GND, one input of the AND gate 20 is "0", the gate output is "0", the input to the mode changeover circuit 13 is "0" and the actual operation mode is thus set. In the actual operation mode of the processing apparatus 1c, when the program voltage VPP (for data writing (erasing) in the EPROM 14) is applied to the shared terminal 11 in the reset state of the control flag 19, the one and other inputs of the AND gate 20 both could become "1". The AND gate output thus could become "1", leading to the inconvenience of changing the input to the mode changeover circuit 13 from "0" to "1".

However,in the processing apparatus 1c, before application of the program voltage VPP, a value "1" is issued to the bit for the control flag 19 on the data bus, and a write signal is applied to the flag 19, so that the output of the control flag 19 is set at "0". Therefore, one input of the AND gate 20 becomes "0", and, if the output of the voltage adjusting circuit 15 becomes "1" by application of high voltage, the output of the AND gate 20 remains at the "0" state. Hence, the mode remains in the actual operation mode, and data writing (erasing) in the EEPROM 14 in the actual operation mode can be executed.

Thus, according to the fourth embodiment, if the reset signal RS is not applied through the reset terminal 4, the processing circuit 12 applies a signal to the reset terminal R of the control flag 19 and the output of the AND gate 20 can be changed. Therefore, the mode can be changed over, without feeding the reset signal RS, on the basis of the output signal of the processing circuit 12 and the level of the voltage supplied to the shared terminal 11 through the voltage adjusting circuit 15.

Figure 6:
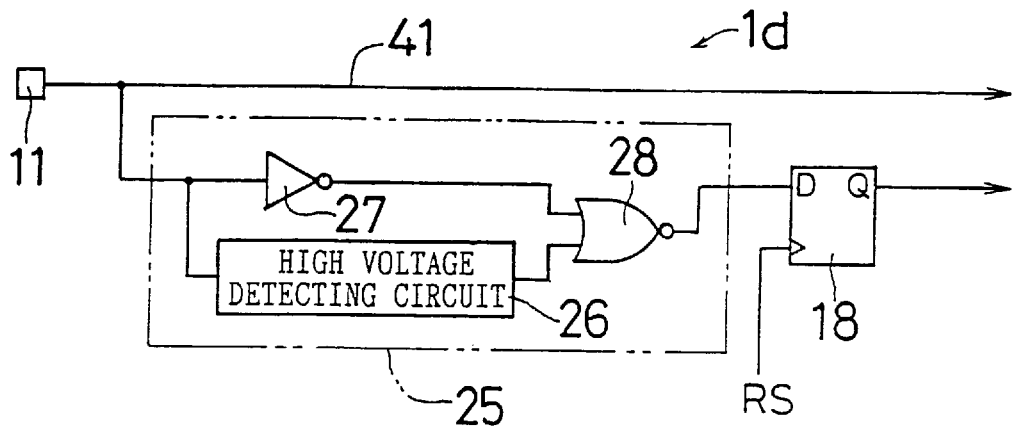
FIG. 6 is a block diagram showing part of a constitution of a processing apparatus Id in a fifth embodiment of the invention.

FIG. 6 is a block diagram showing a part of a processing apparatus Id in a fifth embodiment of the invention. In the processing apparatus Id other constituent elements not shown in the diagram are same as those in the processing apparatus 1 shown in FIG. 1.

It is a feature of the processing apparatus Id that the voltage adjusting circuit 15 of the processing apparatus 1b is replaced by a voltage converting circuit 25 containing a high voltage detecting circuit 26. The voltage adjusting circuit 15 in FIG. 3 is designed to issue signal "1", corresponding to the ordinary supply voltage level, when the input voltage is the supply voltage VDD or the program voltage VPP, and to issue signal "0", corresponding to grounding voltage level, when the input voltage is the grounding voltage GND. The voltage converting circuit 25 in this embodiment is designed to issue signal "1" when the input voltage is the supply voltage VDD only, and to issue signal "0" when the input voltage is grounding the voltage GND or the program voltage VPP.

The voltage converting circuit 25 comprises the high voltage detecting circuit 26, an inverter 27, and a NOR gate 28. In the voltage converting circuit 25, the high voltage detecting circuit 26 and the inverter 27 are connected to the shared terminal 11, and each output is applied to the NOR gate 28.

Figure 7:
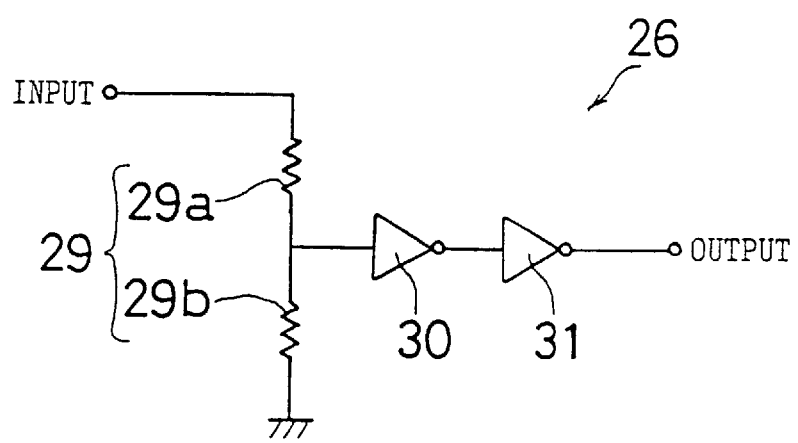
FIG. 7 is a circuit diagram of a high voltage detecting circuit 26.
Figure 8:
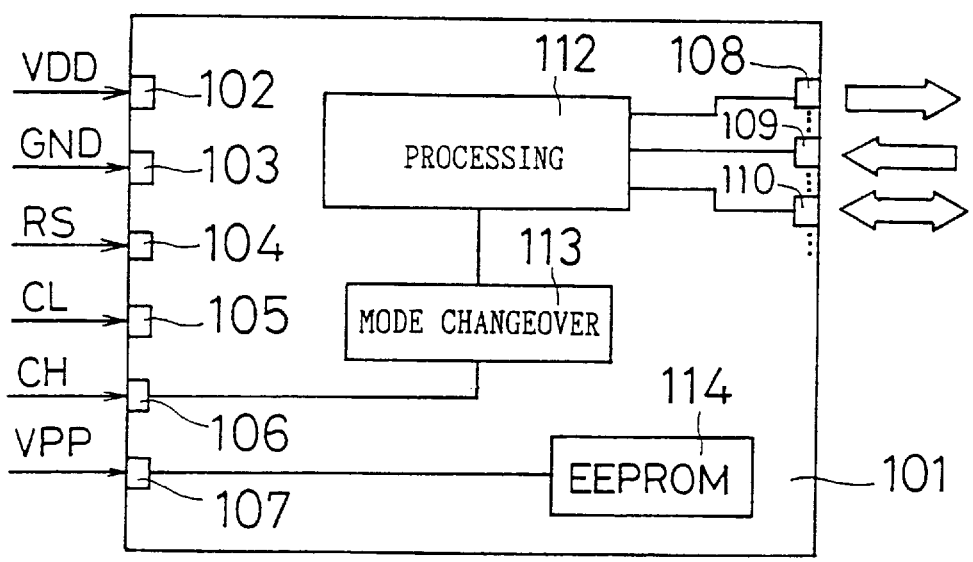
FIG. 8 is a block diagram of a typical processing apparatus 101 of the prior art.

FIG. 7 is a circuit diagram of the high voltage detecting circuit 26. The high voltage detecting circuit 26 includes a resistance circuit 29 which divides the input voltage by resistance and outputs a voltage at ¼ the level, of the input voltages. The circuit 26 further includes two stages of inverters 30 and 31 for receiving the output of the resistance circuit 29. The resistance values 29a, 29b of the resistance circuit 29 are set so as to issue a voltage under the threshold of the inverter 30 when the input voltage is the supply voltage VDD, and to issue a voltage over the threshold value of the inverter 30 when the input voltage is the program voltage VPP. Therefore, when the input voltage is either the grounding voltage GND or the supply voltage VDD, the output of the circuit 26 is "0", and when the input voltage is the program voltage VPP, output of the circuit 26 is "1". Accordingly, when the input voltage is the grounding voltage VDD, the inputs to the NOR gate 28 are "0" and "1", and hence the output of the voltage converting circuit 25 is "0". When the input voltage is the program voltage VPP, similarly, the inputs to the NOR gate 28 are "0" and "1", and hence the output of the voltage converting circuit 25 is "0".

On the other hand, when the input voltage is the supply voltage VDD, the inputs to the NOR gate 28 are both "0", and hence the output of the voltage converting circuit 25 is "1". As in the FIG. 3 embodiment, the output of the voltage converting circuit 25 is transmitted to the mode changeover circuit 13 (not shown) through a D type flip-flop 18 to which a reset signal RS is applied through a clock input. For the input of "1", the mode changeover circuit 13 sets in the test mode, and for the input of "0", it sets in the actual operation mode.

The actual operation mode is thus enabled even with the application of the program voltage VPP to the shared terminal 11. That is, by execution of reset, if the output of the voltage converting circuit 25 is fed into the mode changeover circuit, the level of the signal is "0" indicating the setting of actual mode, and hence the mode is not changed over.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. A processing apparatus comprising:
 a nonvolatile memory capable of writing program data electrically when a write voltage of a predetermined first voltage is supplied to the processing apparatus,
 processing means for processing data on the basis of the program data stored in the nonvolatile memory when an operation voltage of a second voltage lower than the first voltage is supplied to the processing apparatus,
 mode changeover means for setting the processing apparatus in an actual operation mode in which the processing means processes data on the basis of the program data stored in the nonvolatile memory when a first mode changeover signal having a third voltage lower than the second voltage is supplied to the processing apparatus, or setting the processing apparatus in a test mode in which a determination is made whether the operation of the processing means is normal when a second mode changeover signal having the second voltage level is supplied to the processing apparatus, and
 a plurality of terminals for receiving signals to be fed to the nonvolatile memory, the processing means and the mode changeover means at the defined voltage levels,
 wherein one of the terminals is a shared terminal which receives the write voltage, to be supplied to the nonvolatile memory, or to the first or the second mode changeover voltage to be supplied to the mode changeover means.

2. The processing apparatus of claim 1, further comprising voltage adjusting means interposed between the shared terminal and mode changeover means for changing over the level of the first voltage to the second voltage when the first voltage is supplied through the shared terminal, and for outputting the second voltage to the mode changeover means as the second mode changeover signal.

3. The processing apparatus of claim 2, wherein a reset signal is applied to the processing means from one of the plural terminals to reset a signal held in the processing means, and wherein the processing apparatus further comprises:
 transmission control means for applying the output of the voltage adjusting means to the mode changeover means when the reset signal is applied, the transmission control means being interposed between the voltage adjusting means and the mode changeover means.

4. The processing apparatus of claim 2, further comprising:
 a control register for outputting the second or third voltage under control of the processing means, and
 an AND circuit having one input to which an output of the voltage adjusting means is supplied and having another input to which an output of the control register is supplied, the AND circuit being interposed between the voltage adjusting means and the mode changeover means.

5. The processing apparatus of claim 1, wherein a reset signal is applied to the processing means from one of the plural terminals to reset a signal held in the processing means, and wherein the processing apparatus further comprises:
 voltage converting means for outputting the second or third voltage according to the input voltage at the shared terminal, the voltage converting means being interposed between the shared terminal and the mode changeover means, and
 transmission control means for applying the output of the voltage converting means to the mode changeover means when the reset signal is applied, the transmission control means being interposed between the voltage converting means and mode changeover means.

6. The processing apparatus of claim 5, wherein the voltage converting means comprises:

voltage detecting means for outputting the second voltage when the first voltage is supplied, and outputting the third voltage when the second voltage or the third voltage is supplied, and voltage control means for applying the second mode changeover signal to the mode changeover means when the second voltage is supplied from the voltage detecting means, and for applying the first mode changeover signal to the mode changeover means when the third voltage is supplied from the voltage detecting means.

* * * * *